United States Patent
Kase

(12) 
(10) Patent No.: US 6,384,641 B1
(45) Date of Patent: May 7, 2002

(54) SIGNAL SAMPLING CIRCUIT WITH HIGH FREQUENCY NOISE IMMUNITY AND METHOD THEREFOR

(75) Inventor: Kiyoshi Kase, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/873,818

(22) Filed: Jun. 4, 2001

(51) Int. Cl.[7] .............................................. G11C 27/02
(52) U.S. Cl. ......................................... 327/91; 327/96
(58) Field of Search ............................. 327/91, 93–96, 327/337, 561, 563, 554; 330/9; 341/122

(56) References Cited

U.S. PATENT DOCUMENTS

| | | | | |
|---|---|---|---|---|
| 4,389,579 A | | 6/1983 | Stein ........................... 307/353 |
| 4,585,956 A | * | 4/1986 | Lie ............................... 327/94 |
| 4,714,895 A | | 12/1987 | Nicollini et al. ............. 330/258 |
| 4,987,323 A | * | 1/1991 | Fujita ........................... 327/91 |
| 5,291,074 A | * | 3/1994 | Nayebi ......................... 327/94 |
| 5,315,168 A | * | 5/1994 | Norton, Jr. ................... 327/94 |
| 6,028,469 A | * | 2/2000 | Roither et al. .............. 327/362 |
| 6,191,639 B1 | * | 2/2001 | Rau ............................ 327/379 |

\* cited by examiner

*Primary Examiner*—My-Trang Nu Ton
(74) *Attorney, Agent, or Firm*—Robert L. King

(57) ABSTRACT

A signal sampling circuit and method uses a compensating capacitor (30) connected between a ground terminal and an output of an operational amplifier (12) to permit noise error to be applied to both electrodes of a separate output sampling capacitor (18). The noise error component is generated from high frequency noise coupled to the sampling capacitor via a semiconductor substrate. Compensation occurs during a sampling phase and an output operational amplifier (14) is used to filter any high frequency noise during a hold phase.

13 Claims, 1 Drawing Sheet

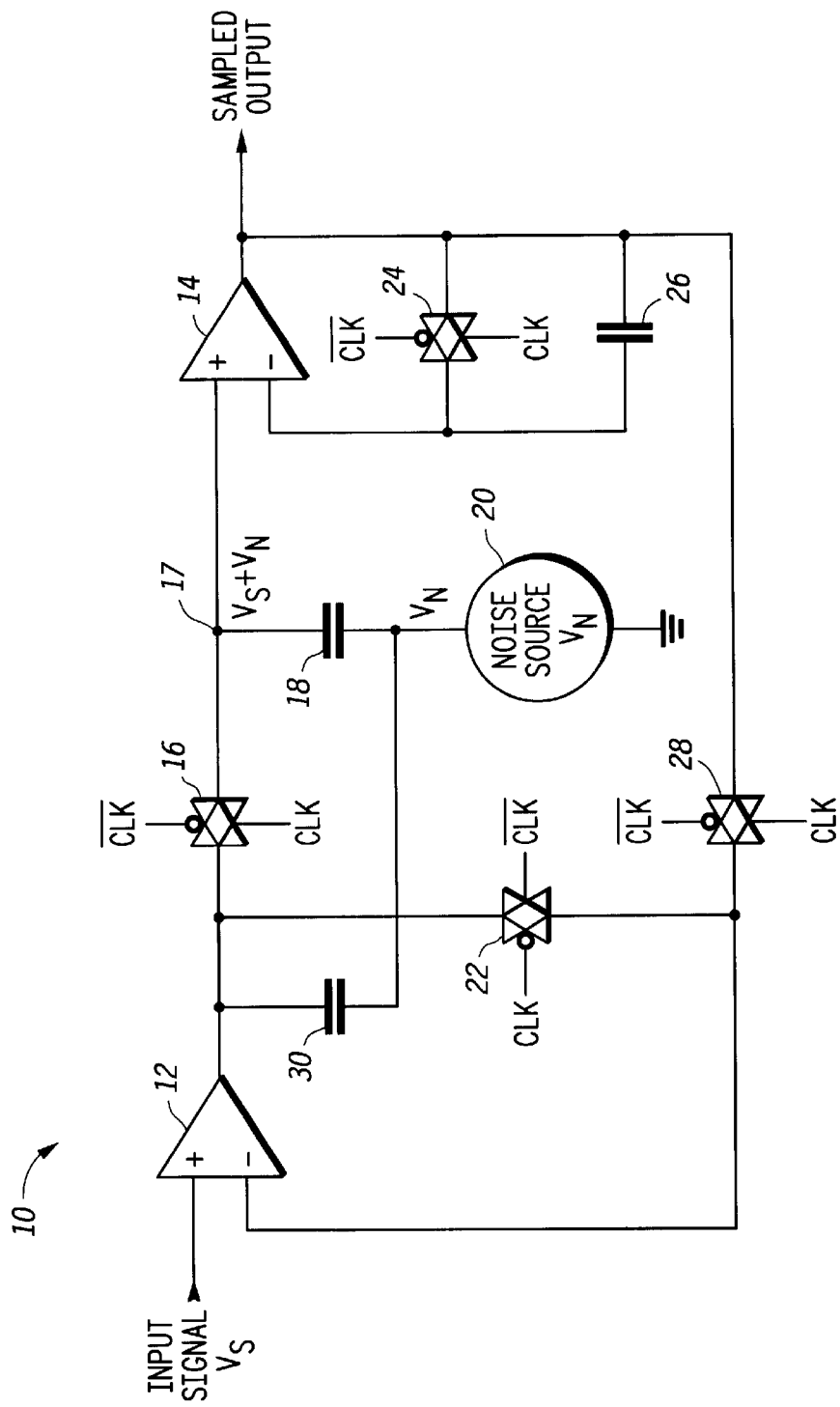
*FIGURE*

SIGNAL SAMPLING CIRCUIT WITH HIGH FREQUENCY NOISE IMMUNITY AND METHOD THEREFOR

FIELD OF THE INVENTION

This invention relates generally to integrated circuits, and more specifically, to sample and hold or track and hold circuits.

BACKGROUND OF THE INVENTION

Sample and hold or track and hold circuits are synonymous terms and are frequently used in electronic circuits where an input signal is sampled and its value is captured or held. Sample and hold circuits are often implemented using operational amplifiers and either a single input structure or a differential input structure is used. An sampling output capacitor is connected to the output of the operational amplifier for storing the sampled input signal and for determining a frequency pole of the circuit, thereby determining frequency stability of the circuit. Coupled to the sampling output capacitor is a buffer amplifier or high impedance circuit that further processes the sampled signal.

The single input structure sample and hold circuit may be implemented with either current sources or voltage sources in an operational amplifier to perform a sample and hold function. An operational amplifier implemented with voltage sources has a low output impedance and is subject to noise from various sources. Noise may be injected into the output signal from the power supply. Additionally, as circuit frequencies have dramatically increased in electronic circuitry a high frequency noise source has been created. When transistors switch at high frequency, such as 1 GHz and higher, the rapid switching transitions of transistors inject a noise signal into the substrate of the integrated circuit. This high frequency noise signal is distributed to other circuitry via the substrate and results in an error. For sample and hold circuitry, noise coupled via the substrate directly results in an error value of the input signal being sampled. Operational amplifiers implemented with voltage sources have little noise immunity, and the substrate voltage noise from high frequency switching is directly coupled onto a sampling capacitor as an error voltage.

An operational amplifier implemented with current sources has a high output impedance, but is also subject to error voltages being coupled onto a sampling capacitor. Because of the high output impedance of such operational amplifiers, such circuits are more commonly used in electronic designs. However, the output terminal of the operational amplifier is subject to having parasitic capacitance to the substrate. The parasitic capacitance functions as a mechanism for coupling any noise injected to the substrate from high frequency transistor switching and is frequency dependent. The high frequency noise is therefore directly coupled to an output sampling capacitor as an error voltage.

Because of the issues mentioned above associated with single input structures used for sample and hold circuits, others have also used a fully differential operational amplifier structure to implement the sample and hold function. However, a fully differential structure requires significantly more circuitry and complexity than a single input structure. For most applications, a single input signal exists. An initial conversion to a differential input signal must be made. The fully differential structure tends to offset error sources that are present in the circuitry, but not all error is completely cancelled. Additionally, in order to sample a single output signal another conversion from a differential output to a single output must be made. Therefore, there is a strong preference to use single input sample and hold circuit.

BRIEF DESCRIPTION OF THE DRAWING

The present invention is illustrated by way of example and is not limited by the accompanying figure, in which like references indicate similar elements.

The FIGURE illustrates in schematic form a sample and hold circuit in accordance with the present invention.

Skilled artisans appreciate that elements in the FIGURE are illustrated for simplicity and clarity and have not necessarily been drawn to scale. For example, the dimensions of some of the elements in the FIGURE may be exaggerated relative to other elements to help improve the understanding of the embodiments of the present invention.

DETAILED DESCRIPTION OF THE DRAWING

As used herein, the terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

The FIGURE illustrates an exemplary embodiment of a Signal Sampling circuit 10. It should be understood that the present invention may be used in any signal sampling application whether a sampled input signal is tracked continuously over time or sampled at discrete time points. An Operational Amplifier 12 has a non-inverting or positive input for receiving an Input Signal having a signal voltage Vs. Operational Amplifier 12 also has an inverting or negative input and an output. A Switch 16 has a first terminal connected to the output of Operational Amplifier 12. In the illustrated form, the switches used herein are complementary metal oxide semiconductor (CMOS) transistor switches known as 'transmission gates'. Such switches are well known in the art. It should be well understood that any type of switching structure may be used in conjunction with the present invention and any type of semiconductor manufacturing process (e.g. bipolar, GaAs, SOS) may be used. A second terminal of Switch 16 is connected at a Node 17 to a non-inverting input of an Operational Amplifier 14. A first electrode of a Sampling Capacitor 18 is connected to Node 17. A second electrode of Sampling Capacitor 18 is directly connected to a reference voltage terminal or ground terminal via an unwanted Noise Source 20. The ground terminal should be understood to represent a reference voltage terminal and any voltage reference may be used other than a circuit ground, if desired. Ideally, and in actuality, Sampling Capacitor 18 is directly connected to ground. However, as will be explained below, the unwanted Noise Source 20 is present as an error source. For purposes of illustration only, Noise Source 20 is illustrated in the FIGURE although no physical circuitry actually exists for the element. A Switch 22 has a first terminal connected to the output of Operational Amplifier 12. A second terminal of Switch 22 is connected to the inverting input of Operational Amplifier 12. A Switch 24 has a first terminal connected to an inverting input of Operational Amplifier 14 and a second terminal connected to an output of Operational Amplifier 14. A Capacitor 26 has a first electrode connected to the inverting input of Operational Amplifier 14, and a second electrode connected to the output of Operational Amplifier 14. The output of Operational Amplifier 14 provides a sampled output signal and is also connected to a first terminal of a Switch 28. A second terminal of Switch 28 is connected to the second terminal of Switch 22 and to the inverting input of Operational Amplifier 12. A Capacitor 30 has a first electrode connected to the output of Operational Amplifier 12 and has a second electrode connected to the second electrode of Sampling Capacitor 18 at the ground terminal (coupled via unwanted Noise Source 20). All of the illustrated switches are clocked by a clock signal labeled Clk and the complement thereof. Each switch is illustrated as having a P-channel clock input, designated with a 'bubble' and an N-channel clock input. The switch is conductive when the Clk signal assumes a logic high or one value. Also, in the illustrated form it is assumed that Operational Amplifiers 12 and 14 are implemented as current source structure operational amplifiers because the design is simplified. In particular, lower values for Sampling Capacitor 18 and Compensation Capacitor 30 may be utilized than when a voltage source structure operational amplifier is used. However, it should be well understood that any type of operational amplifier structure may be used to implement Operational Amplifiers 12 and 14. Operational amplifier 14 functions as an output stage and more particularly as an output amplifier.

In operation, Operational Amplifier 12 receives an analog input that is to be sampled. Operational Amplifier 12, whether implemented as a current source structure or a voltage source structure, functions to buffer the input signal to its output causing the input signal to be sampled onto Sampling Capacitor 18 and Compensation Capacitor 30 when Switch 16 is conductive during a sampling phase of the clock signal. Switch 22 is nonconductive during the sampling phase. Also, during the sampling phase Switches 24 and 28 are conductive. While Operational Amplifier 12 is causing the input signal to be sampled onto Sampling Capacitor 18 and Compensation Capacitor 30, Operational Amplifier 14 is buffering the stored signal on Sampling Capacitor 18 and providing a sampled output signal at the output of Operational Amplifier 14. The output of Operational Amplifier 14 is connected in a feedback path to the inverting input of Operational Amplifier 12 and is used as a differential signal input to Operational Amplifier 12. Switch 24 is also providing the sampled output signal of Operational Amplifier 14 to the inverting input of Operational Amplifier 14 as a feedback signal to provide a different input signal for Operational Amplifier 14.

Therefore, the Sample Output signal continuously tracks the value of the input signal as represented by the signal stored onto Sampling Capacitor 18 and Compensation Capacitor 30 during the points in time when the clock signal is active high. Switch 24 and Capacitor 26 also function to offset and cancel parasitic capacitance effects associated with Switch 16 and Sampling Capacitor 18, respectively. Switch 24 functions to discharge feedback Capacitor 26 every one-half clock cycle. Depending upon the signal value of the input signal, the charge on Sampling Capacitor 18 varies between a ground potential and a power supply voltage rail value. It should be well understood that any power supply voltage value may used with the present invention and the power supply voltage value is determined primarily by the manufacturing process used to implement Signal Sampling Circuit 10. Switch 16 functions to connect the input signal Vs to Sampling Capacitor 18 during a sampling phase and to disconnect Sampling Capacitor 18 from the output of Operational Amplifier 12 during a hold phase. Switch 22 functions to provide a feedback signal from the output of Operational Amplifier 12 to the inverting input of Operational Amplifier 12 during the clock phase when the input signal is not being sampled onto Sampling Capacitor 18 and Compensation Capacitor 30. The operation of Switch 22 prevents Operational Amplifier 12 from being in an open loop when the input signal is not being sampled.

The input signal Vs is typically an input signal provided from circuitry (not shown) and may have any arbitrary frequency value. An example of such circuitry may be a high frequency central processing unit (CPU) or an arithmetic logic unit (ALU) that may be clocked at frequencies in excess of 1 GHz and well above. As a result of the rapid switching of transistors with clock frequencies in that range, switching currents and other noise errors are injected into the semiconductor substrate (not shown) that is used to implement Signal Sampling Circuit 10 and the circuitry generating the input signal. Such currents are translated via the substrate as a voltage, and the substrate voltage is generally represented as unwanted Noise Source 20 having the value Vn. The voltage Vn is connected directly to Sampling Capacitor 18 and is directly added to the input signal Vs to create a voltage of Vs+Vn at Node 17. I have discovered that the use of Compensation Capacitor 30 connected between ground and the output of Operational Amplifier 12 will compensate to offset the harmful affect of the substrate noise, Vn, on the sampling voltage. In particular, Compensation Capacitor 30 functions to level shift the voltage Vn at the electrode of Sampling Capacitor 18 connected to Node 17 by a same amount that the electrode of Sampling Capacitor 18 connected to the substrate via the ground is being shifted. It is therefore critical that Compensation Capacitor 30 be implemented on the same substrate as Sampling Capacitor 18 and Operational Amplifier 12. In one form, Compensation Capacitor 30 is implemented to have a significantly higher capacitance than Sampling Capacitor 18 to permit noise source voltage Vn to be adequately translated at node 17. For example, the output of Operational Amplifier 12 has some finite amount of parasitic capacitance. The value of Compensation Capacitor 30 needs to be significantly larger than this parasitic capacitance. Also, the value of Compensation Capacitor 30 needs to be significantly large enough to determine a frequency pole that will guarantee stable operation for both the feedback loop provided by Switch 22 and the feedback loop provided by Switch 28. As an example only, if Sampling Capacitor 18 assumes a value of two picofarads, Compensation Capacitor 30 may assume a value of approximately ten picofarads.

It should be noted that Switch 16 separates the first electrode of Compensation Capacitor 30 from Sampling Capacitor 18. Compensation Capacitor 30 is providing high frequency noise compensation during the sampling phase by translating both electrodes of Sampling Capacitor 18 a same amount from any high frequency noise source. During a hold period this compensation is removed. Although the high frequency noise source is still present, Operational Amplifier 14 may readily remove any variation at Node 17. Additionally, any variation during the hold phase will be a variation of a correctly compensated sampled value. The sample signal is a much lower frequency signal than the substrate noise. An error that modifies the lower frequency input signal when the input signal is transitioning can not be readily removed by Operational Amplifier 14. However, any variation of the held compensated sample will be at the high frequency, and that variation is readily removed by Operational Amplifier 14 filtering any high frequency error components from the output signal.

By now it should be appreciated that there has been provided a sampling circuit and method of operation for filtering substrate noise originating from either the substrate or from ground potential. A frequency compensating capacitor that is integrated on chip with the sampling circuit is provided for voltage level translating both electrodes of a sampling capacitor by the error voltage. The result is that the output sample voltage has an accurate value that is not influenced or modified by noise error coupled from a ground terminal to the sampling capacitor. The compensating capacitor functions as an anti-aliasing filter for the main signal path. The compensation method is effective for substrate noise in the GHz frequency spectrum. Also, even though the substrate noise path is not identical between positive and negative input paths of an operational amplifier, the compensating method taught herein does not have to account for any such differences in the error signal. The compensation technique is implemented without requiring a fully differential operational amplifier structure, thereby saving transistor count and size. No special electrical isolation is required to implement the sampling compensation method. Because the compensation is very effective, any required A/D conversion of an analog signal is much more accurate using the compensation method.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the operational amplifiers 12 and 14 may be configured as unity gain operational amplifiers in which case there would be no need for switches 22 and 28 and the negative input of operational amplifier 12 is connected directly to ground. Also, operational amplifiers 12 and 14 may implement any predetermined gain factor in the structural configuration illustrated in the FIGURE. Any type of capacitor may be used in connection with this invention. Accordingly, the specification and FIGURE are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A signal sampling circuit comprising:
    an amplifier having an input for receiving an input signal, and an output for providing a buffered output signal;
    a noise compensating means connected between the output of the amplifier and a reference voltage terminal;
    a switch having a first terminal connected to the output of the amplifier and to the noise compensating means, a second terminal, and a control terminal for receiving a control signal; and
    a sampling capacitor having a first electrode coupled to the second terminal of the switch, and having a second electrode coupled to the reference voltage terminal, the sampling capacitor selectively sampling the input signal while the noise compensating means applies any error voltages coupled via the reference voltage terminal to the first electrode of the sampling capacitor, and the sampling capacitor selectively holding the input signal after sampling the input signal.

2. The signal sampling circuit of claim 1 wherein the amplifier is an operational amplifier having a noninverting input for receiving the input signal, and an inverting input selectively coupled to the output thereof by a second switch.

3. The signal sampling circuit of claim 1 further comprising:
    an output amplifier having an input connected to the first electrode of the sampling capacitor and an output for providing a buffered output signal proportional to a sampled signal held by the sampling capacitor.

4. The signal sampling circuit of claim 1 wherein the reference voltage terminal is a circuit ground terminal.

5. The signal sampling circuit of claim 1 wherein the noise compensating means further comprises:
    a compensation capacitor having a first electrode connected to the output of the amplifier and having a second electrode connected to the reference voltage terminal.

6. A method of compensating for high frequency noise error in a sampling circuit, comprising:
    coupling an input signal to an amplifier having an input, and providing a buffered output signal at an output of the amplifier;
    connecting a first electrode of a noise compensating capacitor to the output of the amplifier and connecting a second electrode of the noise compensating capacitor to a circuit reference voltage terminal;
    providing a sampling capacitor connected to the circuit reference voltage terminal, the circuit reference voltage terminal being a source of the high frequency noise error, the sampling capacitor selectively sampling and holding the buffered output signal; and
    selectively switching the output of the amplifier and the first electrode of the noise compensating capacitor to the first electrode of the sampling capacitor, the noise compensating capacitor applying any error voltages coupled via the circuit reference voltage terminal to the first electrode of the sampling capacitor during a sampling phase of the sampling circuit.

7. The method of claim 6 further comprising:
    coupling an output amplifier to the sampling capacitor, the output amplifier filtering any high frequency error components in the buffered output signal that is held by the sampling capacitor.

8. The method of claim 7 further comprising:
    implementing each of the amplifier and the output amplifier as an operational amplifier having a predetermined gain.

9. The method of claim 6 further comprising:
    implementing the circuit reference voltage terminal as a circuit ground terminal.

10. A sampling amplifier with noise compensation comprising:
    a first operational amplifier having a first input for receiving an input signal, a second input, and an output;

an error compensation capacitor having a first electrode connected to the output of the first operational amplifier, and a second electrode connected to a reference voltage terminal;

a first switch having a first terminal connected to the output of the first operational amplifier, a second terminal connected to the second input of the first operational amplifier, and a control terminal for receiving a control signal;

a second switch having a first terminal connected to the output of the first operational amplifier, a second terminal, and a control terminal for receiving the control signal, a sampling capacitor having a first electrode connected to the second terminal of the second switch, and a second electrode connected to the reference voltage terminal; and an output stage having an input connected to the first electrode of the sampling capacitor, the-output stage buffering a sampled signal received from the sampling capacitor.

11. The sampling amplifier of claim 10 wherein the output stage further comprises:

a second operational amplifier having a first input connected to the first electrode of the sampling capacitor, a second input, and an output for providing a sampled output signal;

a third switch having a first terminal connected to the output of the second operational amplifier, a second terminal connected to the second input of the second operational amplifier, and a control input for receiving the control signal;

a feedback capacitor having a first electrode connected to the output of the second operational amplifier, and a second electrode connected to the second input of the second operational amplifier; and a fourth switch having a first terminal connected to the output of the second operational amplifier, a second terminal connected to the second input of the first operational amplifier, and a control terminal for receiving the control signal.

12. The sampling amplifier of claim 10 wherein the first, second, third and fourth switches each comprise a CMOS switch having two control electrodes for receiving complementary versions of the control signal.

13. The sampling amplifier of claim 10 wherein the reference voltage terminal is a ground terminal.

* * * * *